United States Patent [19]

Kawakami et al.

[11] Patent Number: 5,030,800
[45] Date of Patent: Jul. 9, 1991

[54] PRINTED WIRING BOARD WITH AN ELECTRONIC WAVE SHIELDING LAYER

[75] Inventors: Shin Kawakami; Satoshi Haruyama; Hirotaka Okonogi, all of Iruma, Japan

[73] Assignee: Nippon CMK Corp., Japan

[21] Appl. No.: 470,878

[22] Filed: Jan. 26, 1990

[30] Foreign Application Priority Data

Jan. 27, 1989 [JP] Japan ................................. 1-18330

[51] Int. Cl.$^5$ ............................................. H05K 1/00
[52] U.S. Cl. .................................. 174/264; 174/260; 174/258; 174/254; 174/35 R
[58] Field of Search ....................... 174/264, 35 R, 260, 174/258, 254

[56] References Cited

U.S. PATENT DOCUMENTS 3,385,773  5/1968  Frantzen ............................. 174/264
4,383,363  5/1983  Hayakawa et al. ................. 174/264
4,649,461  3/1987  Matsuta .............................. 174/35 R

*Primary Examiner*—Gerald P. Tolin
*Assistant Examiner*—Trinidad Korka
*Attorney, Agent, or Firm*—Bruce L. Adams; Van C. Wilks

[57] ABSTRACT

A printed wiring board for use in an integrated circuit is disclosed. The printed wiring board comprises an insulating sheet having a connecting through hole portion including a possible plated through hole, a printed wiring circuit provided on one or both surface of the insulating sheet, an insulating layer provided on a part of the printed wiring circuit, an electromagnetic wave shielding layer provided on the insulating layer and a part of the printed wiring circuit, a solder resist provided on the electromagnetic wave shielding layer and a sealing member of heat-resistant material or weather-resistant material which is filled or packed in the connecting through hole portion.

8 Claims, 1 Drawing Sheet

PRINTED WIRING BOARD WITH AN ELECTRONIC WAVE SHIELDING LAYER

BACKGROUND OF THE INVENTION

The present invention relates to a printed wiring board, more particularly, a double-sided printed wiring board or a multilayer printed wiring board.

A printed wiring board having an electromagnetic wave shielding layer provided through an insulating layer is well known from Japanese Patent Laid-open No. 213,192/87. The printed wiring board 9 disclosed in this Japanese Patent Laid-open comprises, as shown in FIG. 3, an insulating sheet 1, printed wiring circuits 2 formed on both surface of the insulating sheet 1, an insulating layer 4 provided on a part of the printed wiring circuits 2, an electromagnetic wave shielding layer 5 provided on the insulating layer 4 and a part of the printed wiring circuit 2 and a solder resist layer 6 provided on the shielding layer 5.

The printed wiring board 9 further comprises a connecting through hole portion 7 including a plated through hole 8 provided in the insulating sheet 1, so that the connecting through hole portion 7 and component connecting land (not shown) are not covered with the electromagnetic wave shielding layer 5.

In such a conventional printed wiring board 9 having the electromagnetic wave shielding layer 5, the shielding layer 5 does not cover the connecting through hole portion 7, so that the electromagnetic wave of passive noise or active noise affects on the printed wiring board through the connecting through hole portion 7.

Moreover, provision of the connecting through hole portion 7 including component connecting land (not shown) leads to a division or discontinuity of the electromagnetic wave shielding layer 5, so that an effective aria of the shielding layer becomes decreased and thus sufficient shielding effect can not be obtained.

SUMMARY OF THE INVENTION

It is an object of the present invention to reject the above disadvantages of the conventional printed wiring board.

It is another object of the present invention to provide a printed wiring board having sufficient electromagnetic wave shielding effect.

According to the present invention, there is provided a printed wiring board comprising an insulating sheet having a connecting through hole portion including a possible plated through hole, a printed wiring circuit provided on one or both surface of the insulating sheet, an insulating layer provided on a part of the printed wiring circuit, an electromagnetic wave shielding layer provided on the insulating layer and a part of the printed wiring circuit, a solder resist layer provided on the electromagnetic wave shielding layer and a sealing member of heat resistant material or weather-resistant material which is filled or patched in the connecting through hole portion.

The sealing member is a thermosetting synthetic resin or a photosetting synthetic resin. The sealing member is a conductive synthetic resin including carbon, silver, copper or the like, thereby connecting printed wiring circuit provided on both surface of the insulating sheet.

According to the printed wiring board of the present invention, in the double-sided printed wiring board or multilayer printed wiring board, the sealing member of heat-resistant material or weather-resistant material is filled in the connecting through hole portion, and the electromagnetic wave shielding layer is provided on the connecting through hole and the printed wiring circuits with the interposition of the insulating layer (without a grounded wiring circuit), so that the affect of electromagnetic wave of passive noise or active noise on the printed wiring board can be prevented even at the connecting through hole portion.

Moreover, the electromagnetic wave shielding layer is not divided at the connecting through hole portion, thereby obtaining a large effective area of the shielding layer, so that the printed wiring board with very sufficient electromagnetic wave shielding effect can be obtained.

DETAILED EXPLANATION OF THE PREFERRED EMBODIMENT

Now to the drawings, there is shown one embodiment of a printed wiring board according to the present invention.

Figure 1:
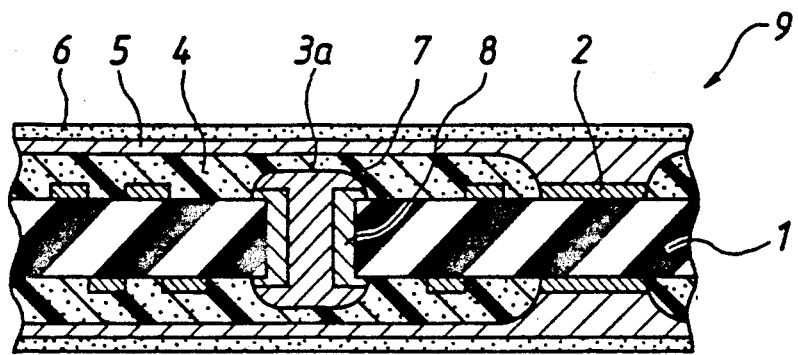
FIG. 1 is an enlarged cross-sectional view showing one embodiment of a printed wiring board according to the present invention.
Figure 2:
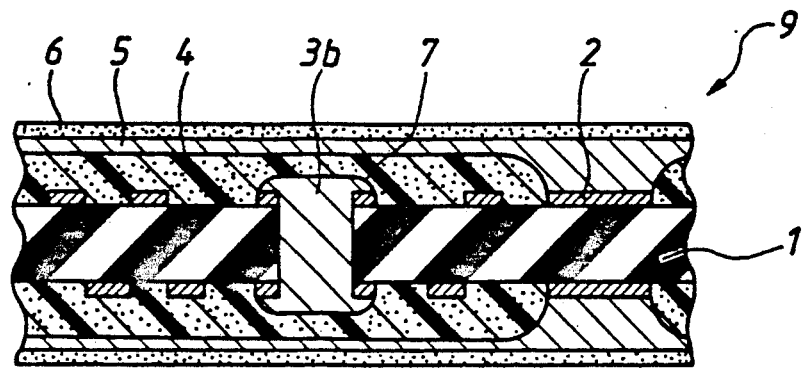
FIG. 2 is an enlarged cross-sectional view showing another embodiment of a printed wiring board according to the present invention.
Figure 3:
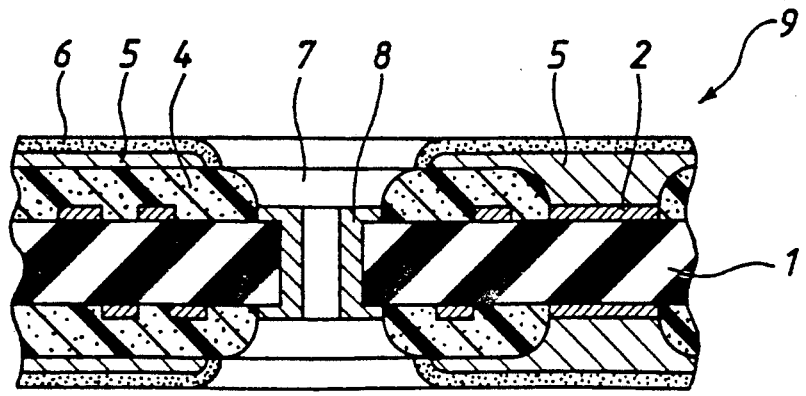
FIG. 3 is an enlarged cross-sectional view showing conventional printed wiring board.

In FIGS. 1, 2 and 3, corresponding components are given the same reference numerals.

FIG. 1 is an enlarged cross sectional view partially showing one embodiment of a printed wiring board according to the present invention. Reference numeral 1 is an insulating sheet having at its both sides printed wiring circuits 2 of given pattern which are connected to each other by a plated through hole 8.

Reference numeral 3a is a sealing member filled in a connecting through hole portion 7. The sealing member 3a consists of a heat-resistant material or a weather-resistant material, such as a thermosetting synthetic resin of epoxide (epoxy) resin or the like or a photosetting synthetic resin of acrylic epoxy resin or the like. The sealing member 3a is formed by filling a conductive paste of the above described synthetic resin in respective connecting through hole portions 7 by a screen printing means, and then by hardening the conductive paste.

An insulating layer 4 is provided on a part of the printed wiring circuits 2 and the sealing member 3a by the screen printing means, and an electromagnetic wave shielding layer 5 is provided on the insulating layer 4 and a part of the printed wiring circuit 2, and finally a solder resist layer 6 is provided on the electromagnetic wave shielding layer 5. The solder resist layer 6 serves also as a protect layer for the shielding layer 5.

FIG. 2 is a partial enlarged cross-sectional view showing another embodiment of a printed wiring board according to the present invention.

In this embodiment, the printed wiring board 9 comprises a sealing member 3b consisting of a conductive synthetic resin material which includes carbon, silver, copper or the like, so that the printed wiring circuits 2 provided on both sides of the insulating sheet 1 may be connected by the conductive sealing member 3b and thus the connecting through hole portion 7 need not be subjected to a plating process. That is, the plated through hole 8 may be omitted.

The other construction of the printed wiring board 9 is the same as that of the printed wiring board 9 shown in FIG. 1, so that its detailed explanation is omitted.

In the above construction, the provision of the insulating layer 4, the electromagnetic wave shielding layer 5 and the solder resist layer 6 is performed by well known manufacturing steps, so that its concrete explanation thereof may be omitted.

It is further understood by those skilled in the art that the foregoing description is a preferred embodiment of the disclosed device and that various changes and modification may be made in the invention without departing from the spirit and scope thereof.

What is claimed is:

1. A printed wiring board comprising: an insulating sheet having a connecting through hole portion for providing an electrical connection, a sealing member in the through hole portion, a printed wiring circuit on at least one surface of the insulating sheet, an insulating layer provided on a part of the printed wiring circuit and over the through hole portion with the sealing member therein, a continuous electromagnetic wave shielding layer provided on the insulating layer and a part of the printed wiring circuit and thereby over the through hole portion, and a solder resist provided on the electromagnetic wave shielding layer.

2. A printed wiring board as claimed in claim 1; wherein the sealing member is a thermosetting synthetic resin.

3. A printed wiring board as claimed in claim 1, wherein the sealing member is a conductive synthetic resin including carbon, silver, copper or the like, thereby connecting printed wiring circuit provided on both surfaces of the insulating sheet.

4. A printed wiring board as claimed in claim 1, wherein the sealing member is a photosetting synthetic resin.

5. A printed circuit board comprising: an insulating substrate having two main surfaces, conductors on at least one main surface and at least one through-hole for providing electrical conduction from one surface to the other; a sealing member in the at least one through-hole; a continuous insulating layer covering a portion of the conductors and the through-hole; and a continuous electromagnetic wave shielding layer covering the insulating layer and thereby the at least one through-hole.

6. A printed circuit board as claimed in claim 5, wherein the sealing member comprises a thermosetting synthetic resin.

7. A printed circuit board as claimed in claim 5, wherein the sealing member comprises a photosetting synthetic resin.

8. A printed circuit board as claimed in claim 5, wherein the sealing member comprises a conductive synthetic resin including carbon, silver, copper or the like.

* * * * *